United States Patent
Yoshida et al.

(10) Patent No.: US 7,199,411 B2
(45) Date of Patent: Apr. 3, 2007

(54) SOLID-STATE IMAGING DEVICE AND CAMERA

(75) Inventors: Shinji Yoshida, Takatsuki (JP); Mitsuyoshi Mori, Kyoto (JP); Takumi Yamaguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/930,814

(22) Filed: Sep. 1, 2004

(65) Prior Publication Data

US 2005/0045925 A1    Mar. 3, 2005

(30) Foreign Application Priority Data

Sep. 3, 2003    (JP) .............................. 2003-311952

(51) Int. Cl.
*H01L 31/062*    (2006.01)
(52) U.S. Cl. ..................... 257/291; 257/292; 257/510
(58) Field of Classification Search ................ 257/291, 257/292, 506, 510, 505
See application file for complete search history.

(56) References Cited

U.S. PATENT DOCUMENTS

| | | | | |
|---|---|---|---|---|
| 5,668,390 A | * | 9/1997 | Morimoto | .................... 257/232 |
| 6,239,839 B1 | * | 5/2001 | Matsunaga et al. | ......... 348/308 |
| 2002/0001039 A1 | | 1/2002 | Ishiwata | |
| 2002/0105585 A1 | * | 8/2002 | Kimura | ...................... 348/308 |
| 2004/0094784 A1 | * | 5/2004 | Rhodes et al. | ............... 257/291 |
| 2004/0173824 A1 | | 9/2004 | Nagasaki et al. | |
| 2006/0076582 A1 | | 4/2006 | Nagasaki et al. | |

FOREIGN PATENT DOCUMENTS

| | | |
|---|---|---|
| EP | 1 455 389 | 9/2004 |
| JP | 10-308507 | 11/1998 |
| JP | 2000-196057 | 7/2000 |

* cited by examiner

*Primary Examiner*—T. N. Quach
(74) *Attorney, Agent, or Firm*—Wenderoth, Lind & Ponack, L.L.P.

(57) ABSTRACT

A solid-state imaging device is formed on a silicon substrate for providing a MOS type solid-state imaging device which has a device isolation structure and causes a small amount of leak current. The solid-state imaging device includes, for each pixel, an imaging region which includes a photodiode having a charge accumulation region of a first conductivity type, a transistor and a device isolation region whose depth is less than a depth of the charge accumulation region of the first conductivity type, at which an impurity density is at maximum.

17 Claims, 13 Drawing Sheets

SOLID-STATE IMAGING DEVICE AND CAMERA

BACKGROUND OF THE INVENTION (1) Field of the Invention

The present invention relates to a MOS type solid-state imaging device intended for a digital camera.

(2) Description of the Related Art

A Metal-Oxide-Semiconductor (MOS) type solid-state imaging device is an image sensor that amplifies and reads out each signal of photon electric charge accumulated in a photodiode within each pixel, using an amplifier circuit that includes an insulated gate field effect transistor formed in each pixel (to be referred to as "MOS transistor" hereinafter). A Complementary MOS (CMOS) image sensor manufactured in the CMOS process, in particular, draws attention as an image input device for a portable device such as a small camera for a Personal Computer (PC). This is the case because it is a device that needs low voltage as well as little electricity to work, and offers an advantage in that it can be constructed, together with its periphery circuit, in chip form.

FIG. 1 is a cross-sectional view showing an example of the structure of an N-channel MOS transistor composing an imaging region of the conventional MOS type solid-state imaging device and a trench isolation unit. As shown in FIG. 1, a P type well region is formed on a silicon substrate 8. In the P type well region, the N-channel MOS transistor is formed and a source region of the N-channel MOS transistor forms a part of a photodiode 10. In the photodiode 10, photons are converted into electric charge (i.e., electric charge is generated by exposure to light). In general, an oxide film formed by LOCal Oxidation of Silicon (LOCOS) is used for a trench isolation unit which isolates the neighboring elements (e.g., MOS transistors). Along with the miniaturization of the solid-state imaging device, an oxide film formed by Shallow Trench Isolation (STI) can also be used for the device isolation region, as can be seen in the trench isolation unit 9 shown in FIG. 1.

FIG. 2 is a diagram showing an example of the structure of the conventional MOS type solid-state imaging device. The MOS type solid-state imaging device is comprised of: an imaging region 27 where plural pixels 26 are two-dimensionally arranged on the silicon substrate 8; a vertical shift register 28 and a horizontal shift register 29 for selecting pixels; and a timing generation circuit 30 for providing pulses necessary for the shift registers. Each pixel 26 in the imaging region 27 is composed of a photoelectric conversion unit 31 and four MOS transistors including a transfer transistor 32, a reset transistor 23, an amplifier transistor 24, and a select transistor 25.

In the imaging region 27, a film stress due to a nitride film or the like, an ion implantation, or an etching process causes defects in the MOS type solid-state imaging device formed by using the LOCOS or the STI for the device isolation region. The defects cause dark currents or white flaws. Moreover, the use of the LOCOS causes difficulty in the miniaturization of the imaging region 27 because a bird's beak width gets longer. The use of the STI causes a problem that stress is generated due to an embedded oxide film.

A method to overcome the problems is disclosed in Japanese Laid-Open Publication No. 2000-196057 (conventional example 1). The method described in the conventional example 1 will be explained with reference to FIGS. 3A–3F. FIGS. 3A–3F respectively show cross-sectional views showing how the device isolation region according to the MOS type solid-state imaging device in the conventional example 1 is built during the manufacturing process.

As shown in FIG. 3A, a $SiO_2$ film is deposited on a semiconductor substrate 61 as a gate dielectric film 52 by means of thermal oxidation so that the thickness of the film becomes 0.1 µm. Then, a channel stopper 53, a photoelectric conversion unit 54 and a drain 55 are formed by performing ion implantation via the gate dielectric film (thermal oxide film) 52. As shown in FIG. 3B, a CVD oxide film 56 is then deposited on the gate dielectric film so that the thickness becomes approximately 0.3 µm. After the deposit of the CVD oxide film (resist) 56, etching is performed on the CVD oxide film 56 and the gate oxide film 52 based on a Reactive Ion Etching (RIE) method using a mask so that a gate channel 57 is opened.

As shown in FIG. 3D, a gate oxide film is then formed in the channel region by performing oxidation again after having deposited a gate electrode 58 made of polysilicon. After that, as shown in FIG. 3E, a polysilicon wiring pattern is formed by performing, using a resist mask, the RIE on the gate electrode 58 with a pattern that is at least larger than the gate channel 57. As shown in FIG. 3F, an interlayer dielectric 59 made of $SiO_2$ and others is deposited and then is partly opened using the RIE method so that the dielectric film 59 is conducted with the drain 55 and a signal line 60 is embedded.

In general, the MOS type solid-state imaging device has an amplifier circuit in each pixel, and is characterized in that a high sensitivity can be realized by amplifying small electric signals. Therefore, in the case where the amount of the leak current leaking into the photodiode is large, the leak current is also amplified and large noises are caused. Due to the noises, the deterioration of the image is a crucial issue. Here, the leak current means all the currents that leak into the photodiode apart from the current generated by converting photons into electric charge in the photodiode.

The study of the miniaturization and the increase in density of the semiconductor device, along with the demand for high performance information processing techniques and miniaturization of portable devices, has presently been underway as energetically as ever. The development of the CMOS type solid-state imaging device in compliance with the 0.18 µm (or below) design rules is currently underway. Further miniaturization of the pixel area and the periphery circuit is one of the targets for the present solid-state imaging device. The high integration and high density of the solid-state imaging device due to such miniaturization is an effective means to achieve high performance, such as high speed or multi-function, in the solid-state imaging device, and is indispensable for manufacturing future solid-state imaging devices.

However, the degradation of the sensitivity due to the decrease in the surface of the imaging region is a problem specific to the miniaturization as described above. For example, the sensitivity in the photodiode region indicates the smallest quantity of photon electric charge in which an amount of photoelectric converted charge surpasses an amount of noise charge caused by the leak current. The decrease in the amount of noise electric charge is indispensable for improving the sensitivity.

As described above, the miniaturized MOS transistor has been developed utilizing miniaturization technology for semiconductor LSI, and the reality is that no attention has been paid to the leak current. For instance, the STI, which has already been explained as being used for a device isolation structure suitable for the miniaturization of the solid-state imaging device, is widely used for the semiconductor devices. The STI, however, due to its structure in which a trench is formed in a silicon substrate by performing dry etching and the trench is filled with an oxide film, causes high stress within the silicon substrate because of the difference in thermal expansion coefficient between the filled oxide film and the silicon substrate. The stress concentrates on the corners of the bottom part of the trench due to their steep angles. The existence of the stress that is resistant to crystals increases the density of crystal defect for stabilizing crystal energy. The electrons generated due to the crystal defect are one of the causes of the leak current.

The interface state that is not involved in bonding is formed as the interface between the silicon substrate and the embedded oxide film where non-bonding electrons exist. With the STI, the crystal structure on or in the vicinity of the interface between the silicon substrate and the embedded oxide film is extremely disordered, since the trench isolation unit is formed by means of dry etching.

This is why many non-bonding electrons that are not involved in bonding are found on or in the vicinity of the interface (the non-bonding electrons on and in the vicinity of the interface is termed "interface state leak"). A large leak current is caused by this interface state leak.

As described above, the solid-state imaging device having the MOS transistor miniaturized by the semiconductor LSI technique faces a problem that the leak current caused by the crystal defect induced by the stress and the leak current generated from the interface state with the STI which includes the silicon surface cause much larger noises. According to the MOS type solid-state imaging device and the manufacturing method, as described in the background art above, the device isolation region is formed by means of channel stop implanting. Further, it is necessary to widen the width of the device isolation region in order to retain enough withstanding pressure in the device isolation region.

SUMMARY OF THE INVENTION

The present invention is conceived in view of the above problems, and an object of the present invention is to provide a MOS type solid-state imaging device that can easily realize the miniaturization of the imaging region and the retaining of the withstanding pressure in the device isolation region.

In order to achieve the above object, the solid-sate imaging device according to the present invention is a solid-state imaging device comprising, for each pixel, an imaging region including: a photodiode having a charge accumulation region of a first conductivity type; and a transistor for reading out the charge obtained by the photodiode, wherein the imaging region includes a device isolation region for isolating the transistor from a neighboring transistor that is placed outside the imaging region, and a depth of the device isolation region is less than a depth of the charge accumulation region, the depth of the region being a depth at which impurity density of the region is at maximum.

Thus, with the depth of the device isolation region made less than the depth of the charge accumulation region at which the impurity density is at maximum, the stress imposed on the photodiode is greatly reduced. As a result, it is possible to reduce the amount of leak current because the generation of crystal defect is suppressed in the photodiode. The result can be applied both to the device isolation region based on the STI and the device isolation region based on the LOCOS.

It should be noted that the MOS transistors are N-channel type MOS transistors. However, they may be P-channel type MOS transistors instead. In this case, the MOS transistor has a structure in which the source and the drain which make up a P type diffusion region are formed in the N type semiconductor substrate (or an N type well). The transistors composing a circuit other than the imaging region may be CMOS transistors.

The present invention is characterized in that the solid-state imaging device is used for a camera. By suppressing the amount of dark current using the method described above, a solid-state imaging device with extremely small noises can be manufactured. It is, therefore, possible to realize the camera that can function under the condition of low-light intensity.

With the MOS type solid-state imaging device according to the present invention, it is possible to reduce the noises due to leak current by rendering the structure of the device isolation region specifically placed between the MOS transistors. Therefore, the practical value is very high.

FURTHER INFORMATION ABOUT TECHNICAL BACKGROUND TO THIS APPLICATION

The disclosure of Japanese Patent Application No. 2003-311952 filed on Sep. 3, 2003, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The following describes the embodiments of the present invention with reference to the drawings.

First Embodiment

Figure 1:
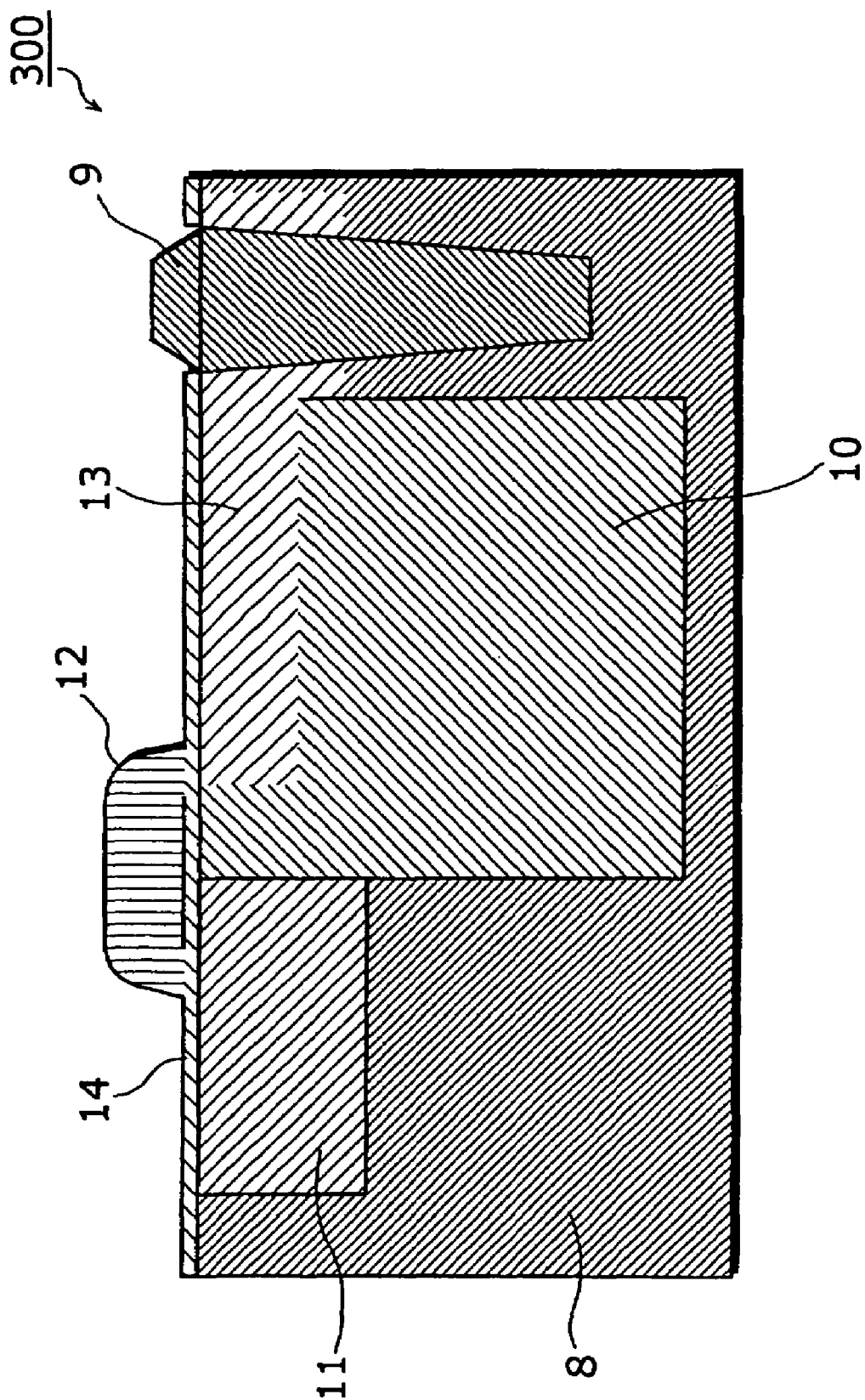
FIG. 1 is a cross-sectional view showing an example of a structure of a MOS transistor composing an imaging region and of a trench isolation unit of a conventional MOS type solid-state imaging device.
Figure 2:
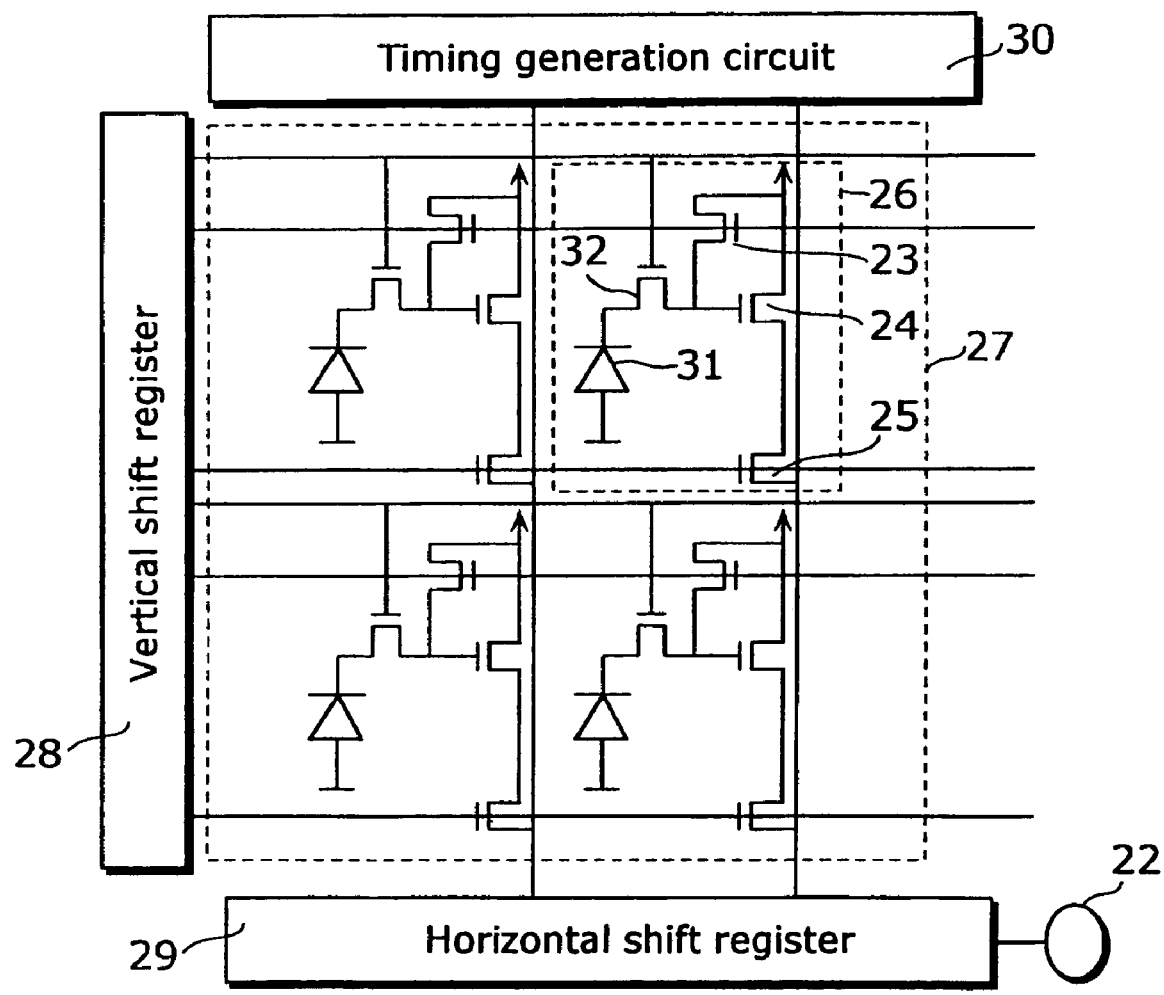
FIG. 2 is a diagram showing an example of the structure of the conventional MOS type solid-state imaging device.
Figure 3:
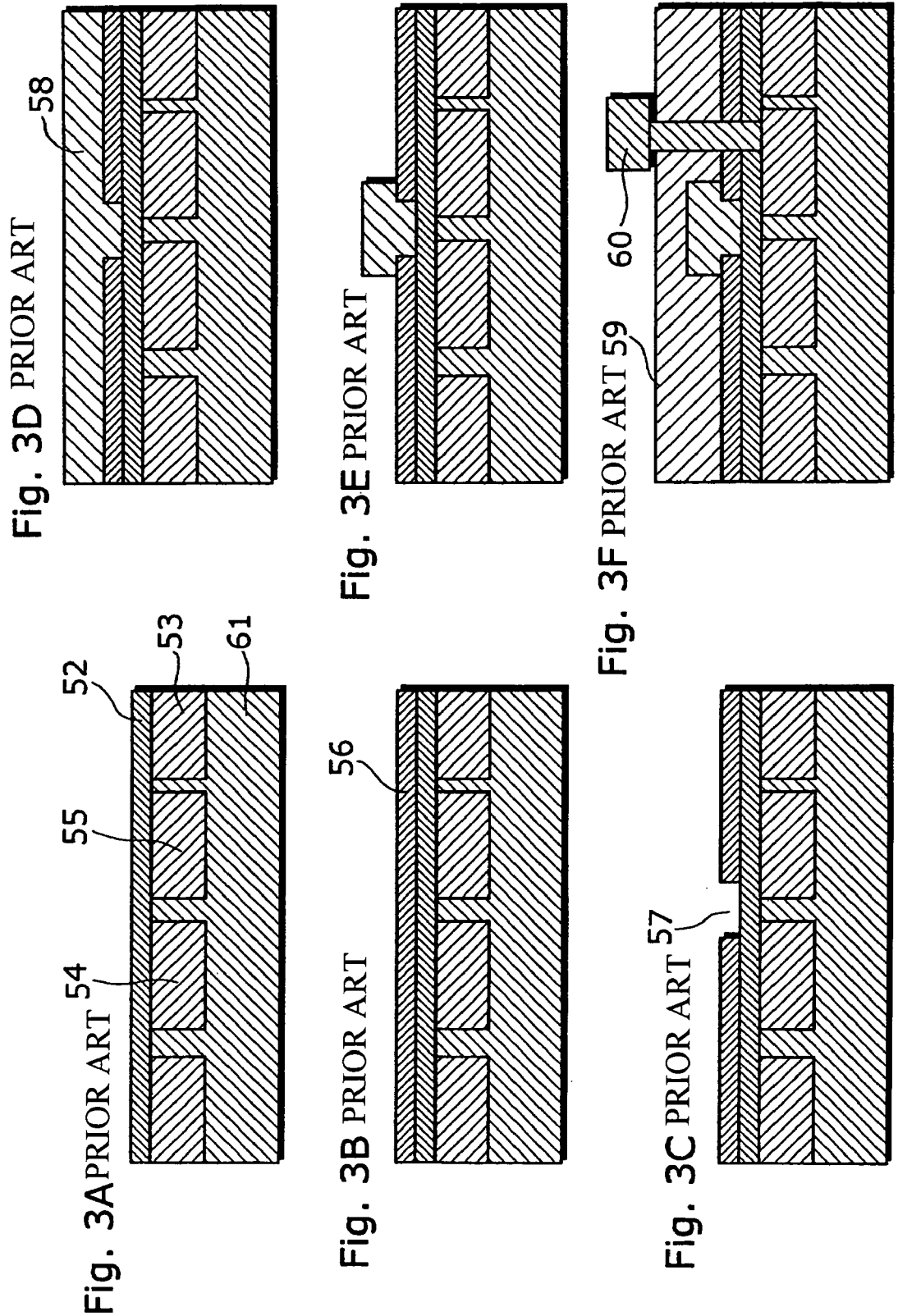
FIGS. 3A through 3F respectively show cross-sectional views indicating how the device isolation region is built in the conventional solid-state imaging device.
Figure 4:
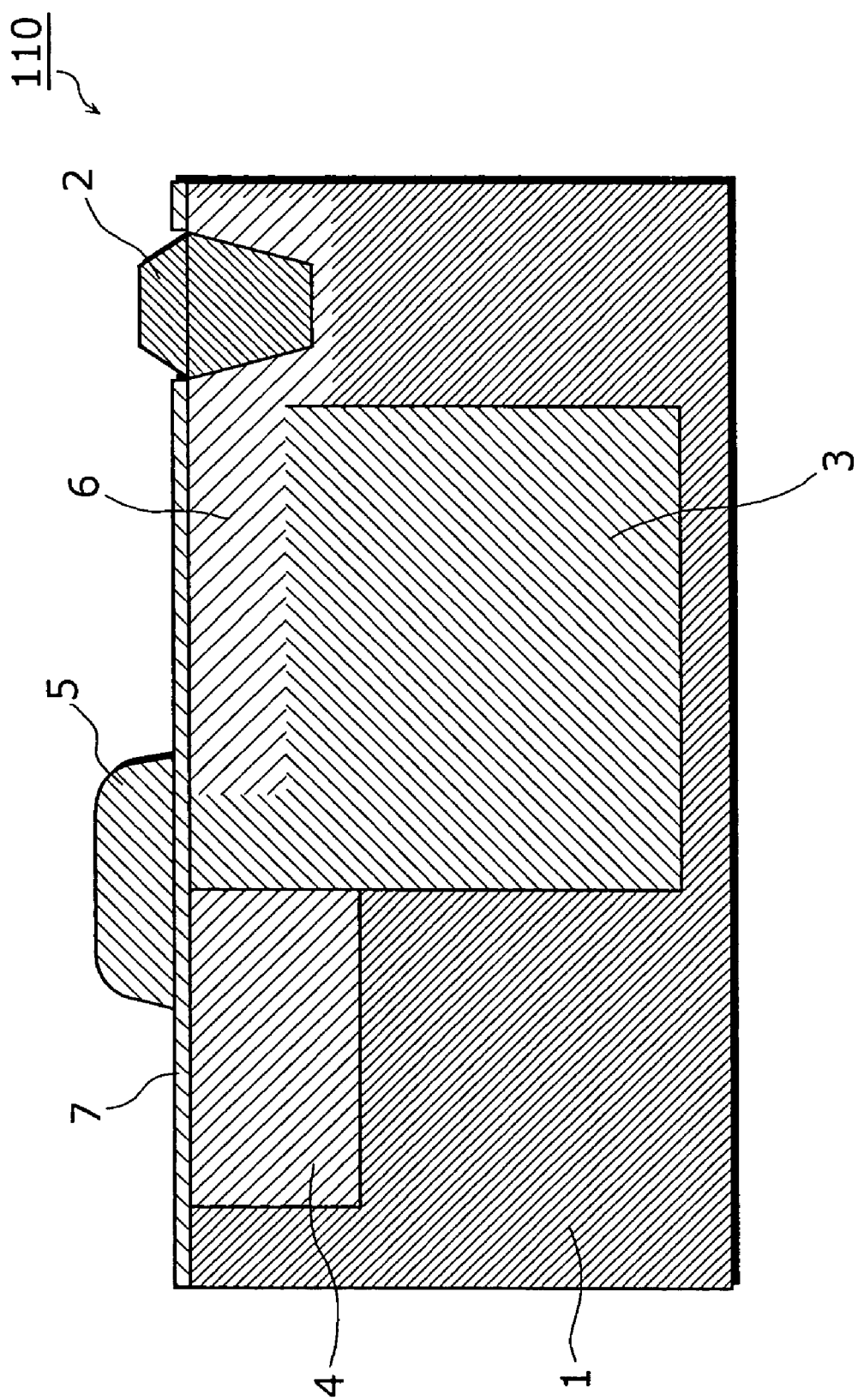
FIG. 4 is a cross-sectional view showing an example of the structure of a MOS transistor composing an imaging region and of a trench isolation unit of a MOS type solid-state imaging device according to the present invention.

FIG. 4 is a cross-sectional view showing the structure of the N-channel MOS transistor used for the imaging region and the structure of the trench isolation unit in the MOS type solid-state imaging device 110 according to the present embodiment. The MOS transistor is isolated from a neighboring MOS transistor by a device isolation region 2. A photodiode 3 is formed as an N type diffusion region within a silicon substrate (or a P type well) 1. The photodiode 3 also serves as the source of the MOS transistor in the imaging region, and the device isolation region 2 is formed in the region adjoining the photodiode 3, as is the case of other MOS transistors.

It is preferable that a P type diffusion region is formed as a dark-current suppression layer 6 in the periphery of the surface of the N type diffusion region being the photodiode 3. In this case, the dark-current suppression layer 6 extends, as shown in FIG. 4, to the periphery of the device isolation region 2. It is also preferable that the dark-current suppression layer 6 is formed in the position ranging from 10 to 200 nm below the surface of the silicon substrate 1. In order to improve the sensitivity, it is desirable that the dark-current suppression layer 6 is formed in the position ranging from 10 to 100 nm below the surface of the silicon substrate 1. The device isolation region 2 is formed using a dry etching method, and the depth ranges from 1 to 200 nm, which is shallower than that of the dark-current suppression layer 6.

Figure 5:
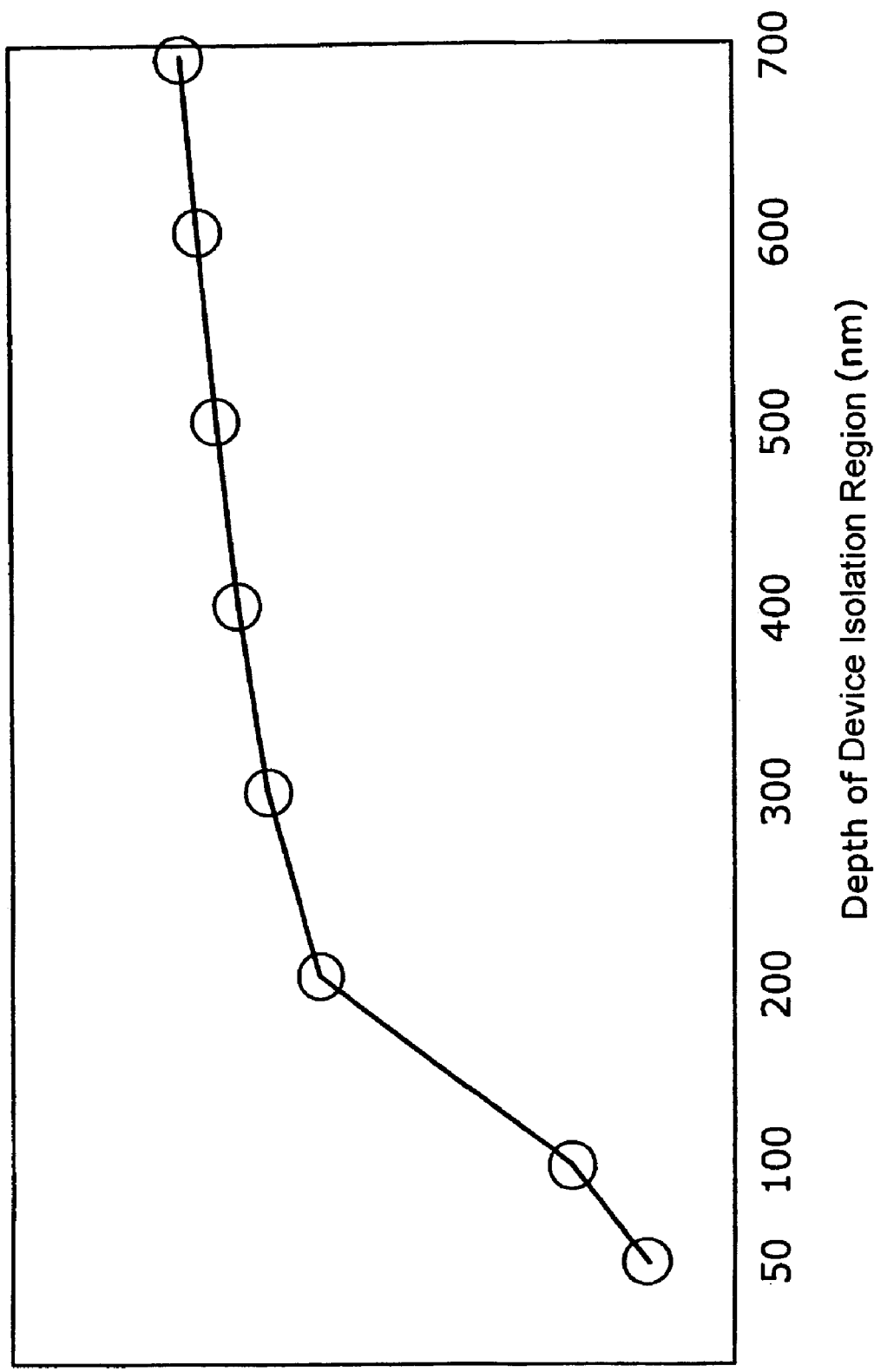
FIG. 5 is a diagram showing the relationship between an average value of vertical stresses that remain in a boundary between a photodiode and a dark-current suppression layer.

FIG. 5 is a diagram showing the relationship between an average value of the vertical stresses that remain in the boundary between the photodiode and the dark-current suppression layer, and the depth of the device isolation region 2. It should be noted that the depth of the device isolation region 2 ranges from 50 to 700 nm.

The average value of the stresses is a value obtained as a result of logic calculation made in an elastic flow model. As shown in FIG. 5, when the depth of the device isolation region 2 ranges from 200 to 700 nm, the average value of the stresses is rather high and does not virtually depend on the depth of the device isolation region 2. However, it is assumed that the depth of the boundary between the photodiode and the dark-current suppression layer 6 is 200 nm. FIG. 5 also indicates that the remaining vertical stresses of the photodiode suddenly decrease when the depth of the device isolation region 2 is shallower. This is attributed greatly to the decrease in a depth-width ratio of the device isolation region 2 in addition to the increasing distance between the device isolation region 2 and the boundary between the photodiode and the dark-current suppression layer 6.

Therefore, based on the fact that an enthalpy of formation in crystal defect increases as the stress increases, it is possible to suppress the generation of the crystal defect by decreasing the amount of stress. Consequently, it is possible to reduce the amount of leak current so as to reduce the noises, by setting the depth of the device isolation region to 200 nm or less than 200 nm.

In particular, it is preferable to set the depth of the device isolation region within the range of 1 to 100 nm in order to reduce the amount of leak current.

Figure 6:
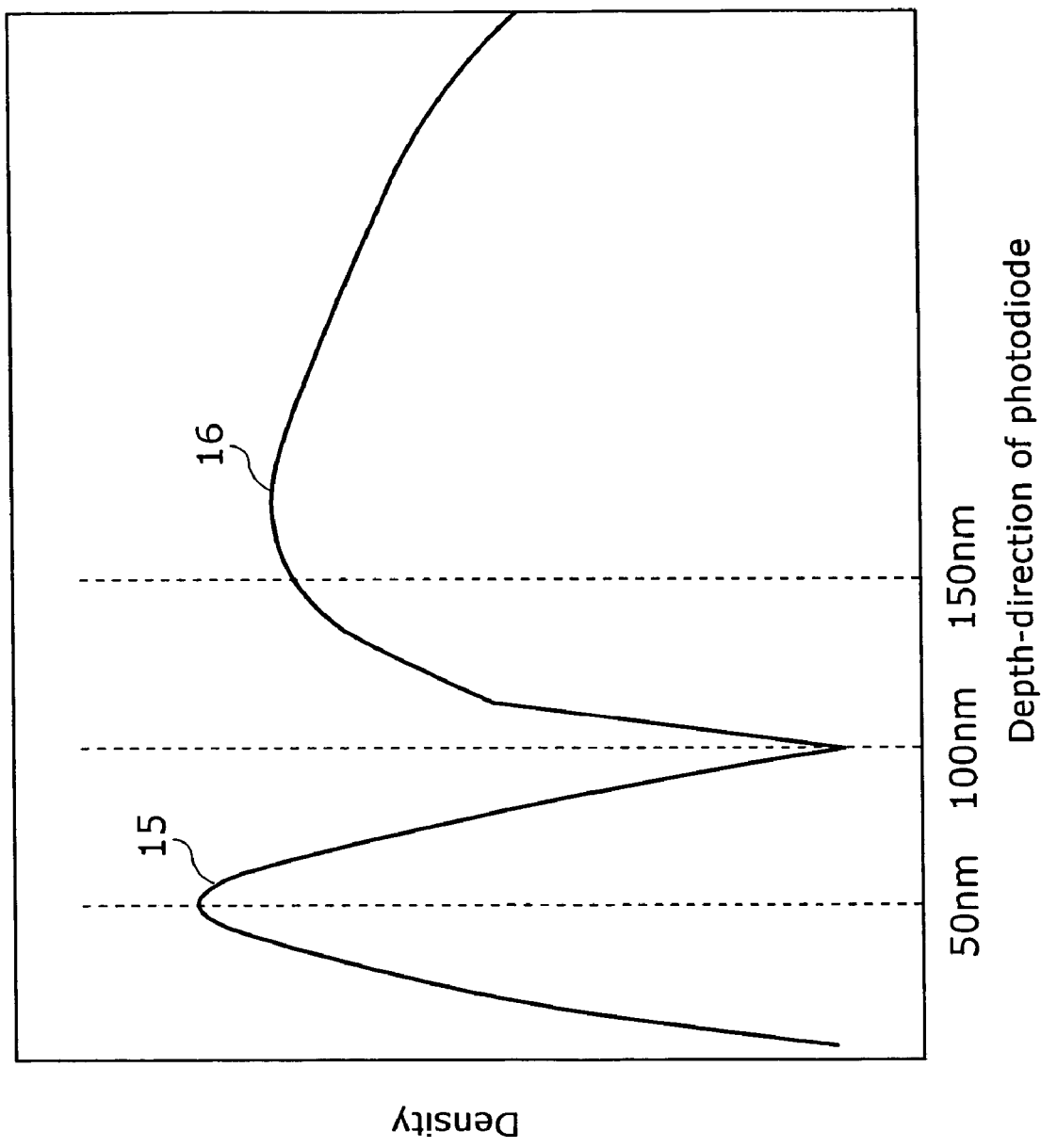
FIG. 6 is a diagram indicating levels of impurities in the photodiode and the dark current suppression layer.

FIG. 6 is a diagram showing the impurity density profile in the cross-section vertical to the silicon substrate surface on the photodiode. In FIG. 6, a vertical axis indicates impurity density whereas a horizontal axis indicates a depth measured from the silicon substrate surface. The impurity density profile shown in FIG. 6 shows a suitable distribution which allows a highly efficient accumulation of the photon electric charge on the photodiode and an effective read transfer. The impurity density profile shows two density maxima: the less steep one indicates the dark-current suppression layer, and the depth at which the density is at maximum is approximately 50 nm; and the steeper one indicates the photodiode, and the depth at which the density is at maximum ranges from 150 to 200 nm. The depth of the device isolation region measured from the surface of the silicon substrate is set as 150 nm or less than 150 nm. Thus, it is possible to prevent the recombined electrons generated at the boundary between the device isolation region and the silicon substrate from being diffused directly on the photodiode so as to suppress the dark current, by placing the device isolation region in a position distant from a depletion layer in the photodiode. It is possible to set, as described above, the depth of the device isolation region to the same level as that of the dark-current suppression layer or shallower than the level of the dark-current suppression layer by setting the depth of the device isolation region measured from the surface of the silicon substrate to 100 nm or less than 100 nm. The depth of the dark-current suppression layer (i.e., the depth of the boundary between the photodiode and the dark-current suppression layer measured from the surface of the silicon substrate) should be 200 nm or less than 200 nm in order to suppress light absorption by the dark-current suppression layer so as to prevent the decrease in the sensitivity. It is preferable that the depth of the dark-current suppression layer ranges from 10 to 100 nm. As shown in FIG. 6, in the profile of implanted impurity density within the silicon substrate for the optimized photodiode and the dark-current suppression layer, the impurity density of the boundary between the dark-current suppression layer and the photodiode is approximately 100 nm from the surface of the silicon substrate. By forming the device isolation region within the dark-current suppression layer, it is possible to suppress rebounding and diffusion of the leak electrons generated in the boundary between the device isolation region and the silicon substrate, and to further suppress the amount of leak current. As shown in FIG. 6, the depth of the maximum density for the impurities in the dark-current suppression layer is approximately 50 nm. By setting the depth of the device isolation region measured from the silicon substrate to 50 nm or less than 50 nm, a diffusion activation energy of recombined electrons generated at the boundary between the device isolation region and the silicon substrate increases greatly in the photodiode direction. Thus, within the range of temperature from 300 K to 373 K, it is possible to prevent the accumulation of the leak current in the photodiode so as to reduce the amount of white flaws.

It should be noted that the device isolation region 2 shown in FIG. 4 is formed based on the STI. However, the formation may be based on the LOCOS instead. The present invention is particularly effective in the case where the device isolation region 2 is formed based on the STI. The following explains the reasons.

Figure 7:
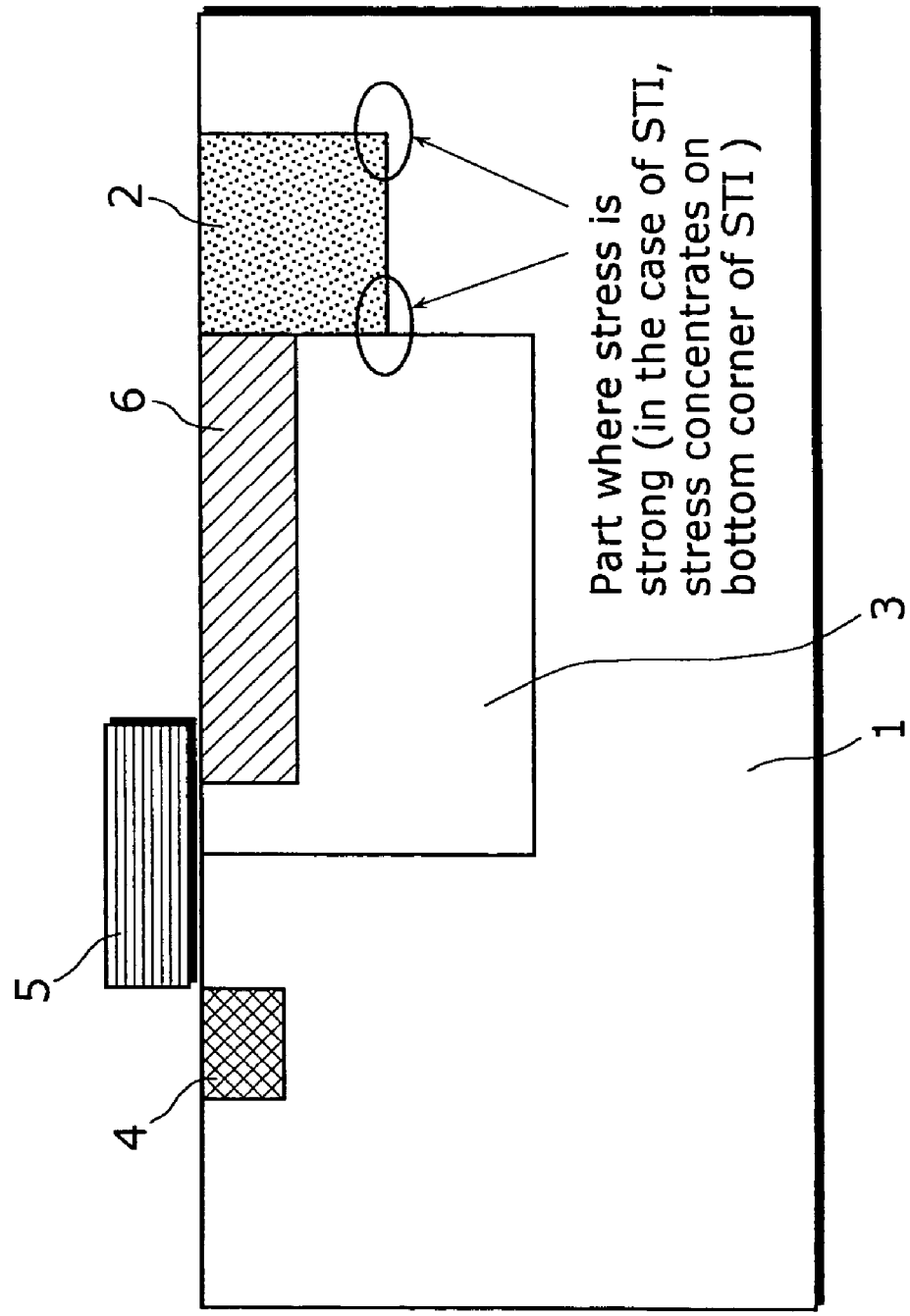
FIG. 7 is a diagram showing a part of a device isolation region formed by STI on which the stress concentrates.

FIG. 7 is a diagram showing a part of the device isolation region 2 formed by the STI on which the stress concentrates. The device isolation based on the LOCOS or the STI is conceivable for the device isolation region 2. In the case of device isolation based on the STI, as shown in FIG. 7, a large amount of leak current is generated in the regions where the semiconductor adjoins the bottom corners of the device isolation region 2. This is due to the concentration of stress in the bottom corners of the device isolation region 2. Therefore, the amount of the leak current that leaks into the surface of the photodiode varies greatly depending on the position in depth direction of the bottom of the device isolation region 2. This means that the amount of the leak current that leaks into the photodiode greatly changes according to four positions in the depth direction including: the depth of the photodiode; the depth of the photodiode 3 at its maximum density; the depth of the dark-current suppression layer placed at the upper part of the photodiode; and the depth of the dark-current suppression layer at its maximum density.

It should be noted that the MOS transistor exemplified in the above description is an N-channel type MOS transistor, but it may be a P-channel type MOS transistor for composing the MOS type solid-state imaging device. In this case, the MOS transistor has a structure in which the source and the drain being P type diffusion regions are formed within the N type semiconductor substrate (or N type well). The photodiode is composed of the P type diffusion region while the dark-current suppression layer is composed of the N type diffusion region.

The circuit for driving the imaging region in the solid-state imaging device includes plural MOS transistors and these MOS transistors are isolated by the device isolation region. For the structure of the device isolation, the same structure as that of the trench isolation unit can be used. Namely, the depth of the trench ranges from 1 to 200 nm, either as same as that of the dark-current suppression layer or shallower than the dark-current suppression layer.

It is preferable that all the MOS transistors composing the imaging region and the periphery drive circuit are either N-channel type MOS transistors or P-channel type MOS transistors. Particularly considering the fact that a high-speed operation can be achieved in the drive circuit, it is preferable that all the MOS transistors are N-channel type MOS transistors.

Here, the following explains the reason why the solid-state imaging device composed of the MOS transistors of the same conductivity type which make up the drive circuit is preferable over the solid-state imaging device composed of the CMOS type drive circuit.

Figure 8:
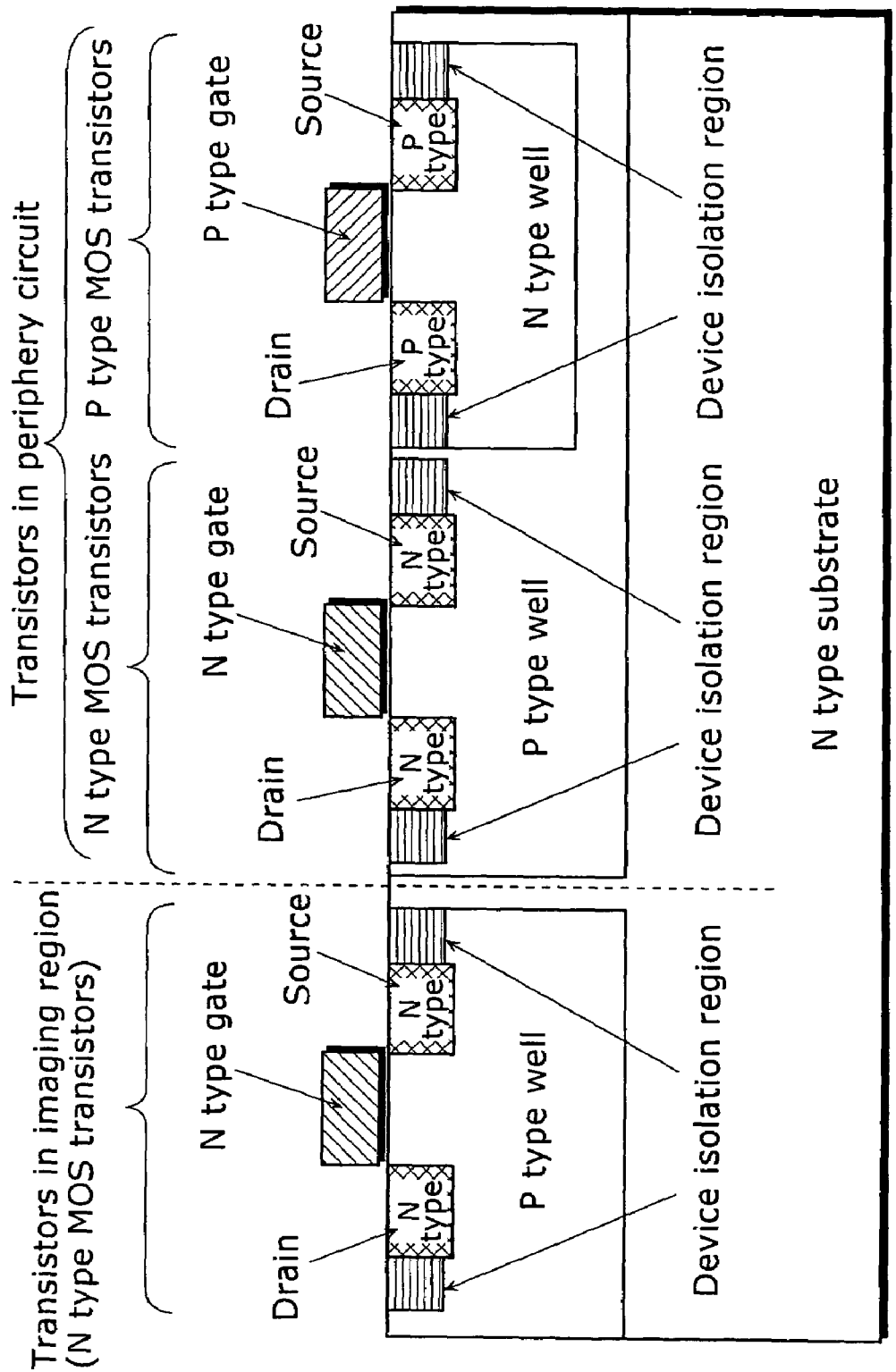
FIG. 8 is a cross-sectional view of a transistor in the imaging region and transistors in a periphery circuit region.

FIG. 8 is a cross-sectional view of the transistors in the imaging region and the transistors in the periphery circuit region.

In the case of CMOS type solid-state imaging device, the transistors in the imaging region are N type transistors whereas the transistors in the periphery circuit region are N type transistors and P type transistors.

As can be seen in the present invention, in the case of making the device isolation region shallower, the negative effect is that the ability of the device isolation region to isolate the N type transistors and the P type transistors may decrease. Here, the elements may be deconstructed because of the current that flows, though it should not, between the N type transistors and the P type transistors due to a latch-up phenomena.

Figure 9:
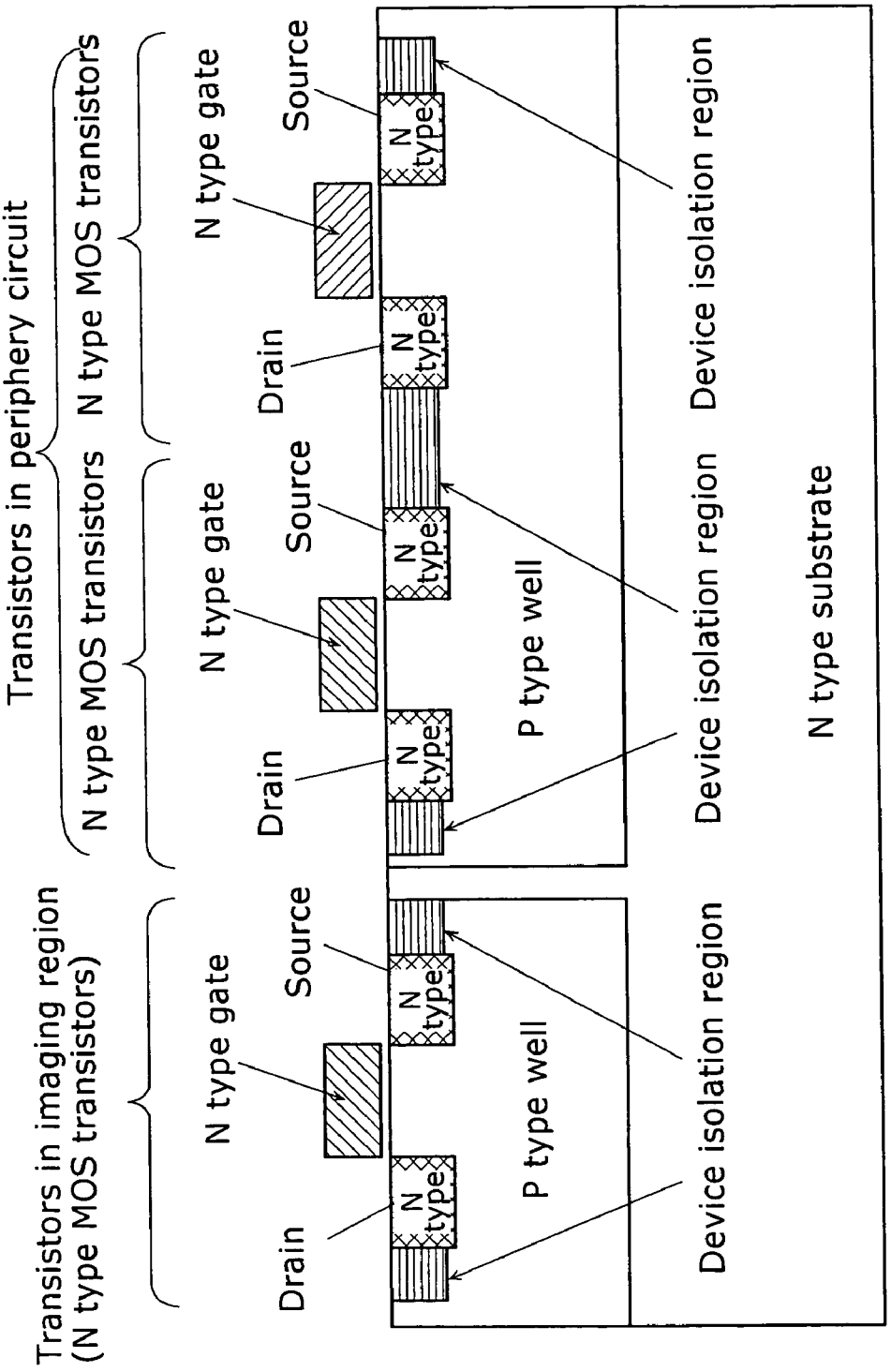
FIG. 9 is a cross-sectional view of the solid-state imaging device in a case where the periphery circuit is formed only by N type transistors.

FIG. 9 is a cross-sectional view of the solid-state imaging device in the case where the periphery circuit is formed only of N type MOS transistors. It is possible to eliminate the negative effects that appear in the case where the device isolation region is made shallower, by forming the periphery circuit only of the N type transistors so that the latch-up phenomena generated in the case of the CMOS type solid-state imaging device can be eliminated. Thus, a solid-state imaging device without the negative effects can be realized by using only the N type transistors for the transistors in the imaging region and those in the periphery circuit in the N type-MOS solid-state imaging device.

FIGS. 8 and 9 respectively show the case where the transistors in the imaging region are N type transistors. In the case where the transistors in the imaging region are P type transistors, a solid-state imaging device without negative effects can be realized by using only the P type transistors for the transistors in the imaging region and those in the periphery circuit in the P type solid-state imaging device.

Second Embodiment

Figure 10:
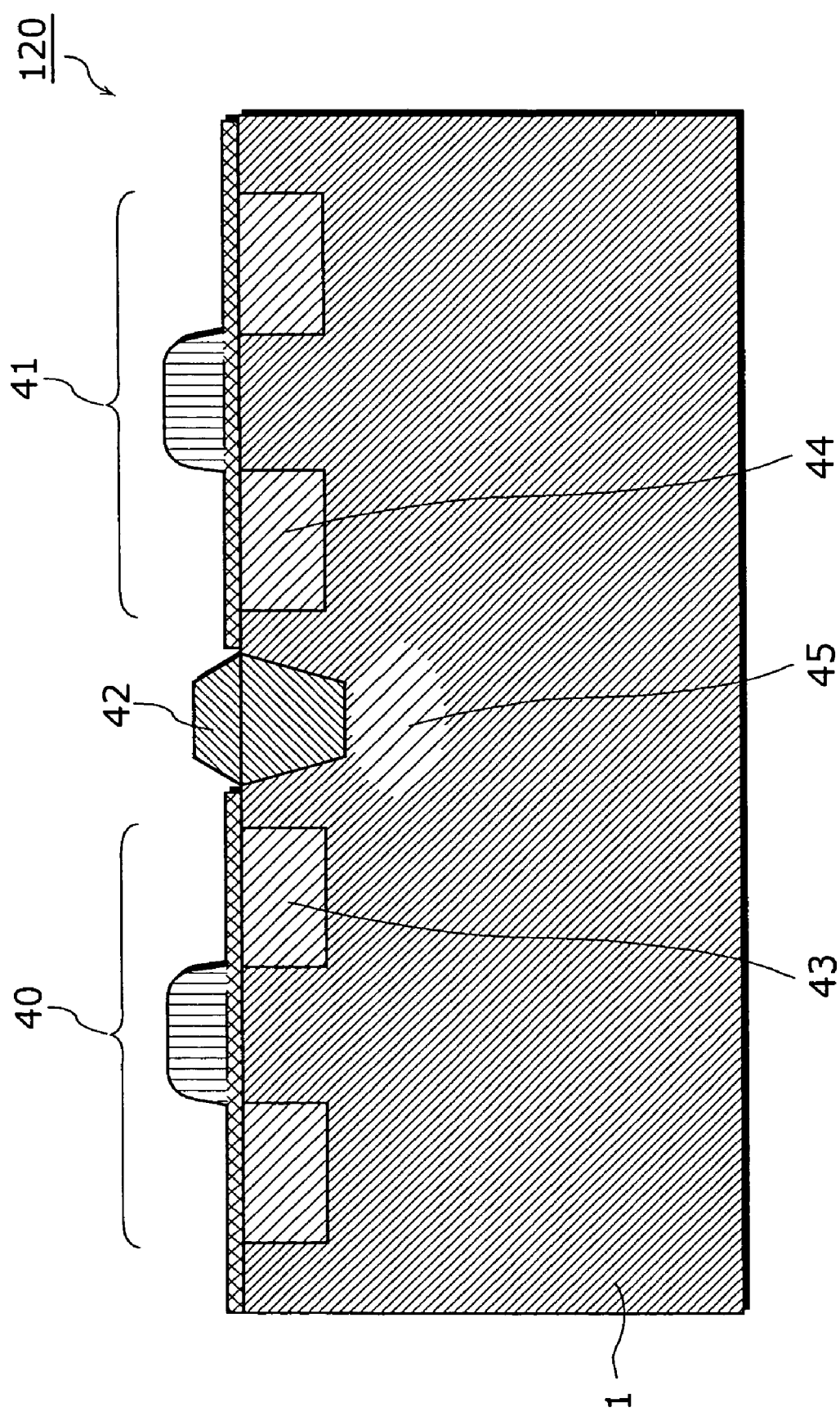
FIG. 10 is a cross-sectional view showing an example of the structure of MOS transistors and of a device isolation region of a MOS type solid-state imaging device according to the second embodiment of the present invention.

FIG. 10 is a cross-sectional view showing the structure of the MOS type solid-state imaging device according to the present embodiment, wherein the imaging region and the periphery circuit are respectively made up of multiple MOS transistors that are isolated by the device isolation region. FIG. 10 shows the structure of the device isolation region between the MOS transistors in the imaging region or in the periphery circuit. The diagram also shows how transistors 40 and 41 are isolated by a device isolation region 42. The leak current is generated between an activation region in the transistor 40 and an activation region 44 in the transistor 41 by setting the depth to be ranged from 1 to 200 nm by which the device isolation region 42 erodes the silicon substrate 1. By placing an impurity diffusion layer 45 that suppresses the amount of leak current at a position that is directly below the device isolation region 42, as shown in FIG. 10, it is possible to suppress the amount of leak current between the transistors as the withstanding pressure relating to the leak current between the transistors isolated by the device isolation region 42 rises.

Third Embodiment

Figure 11:
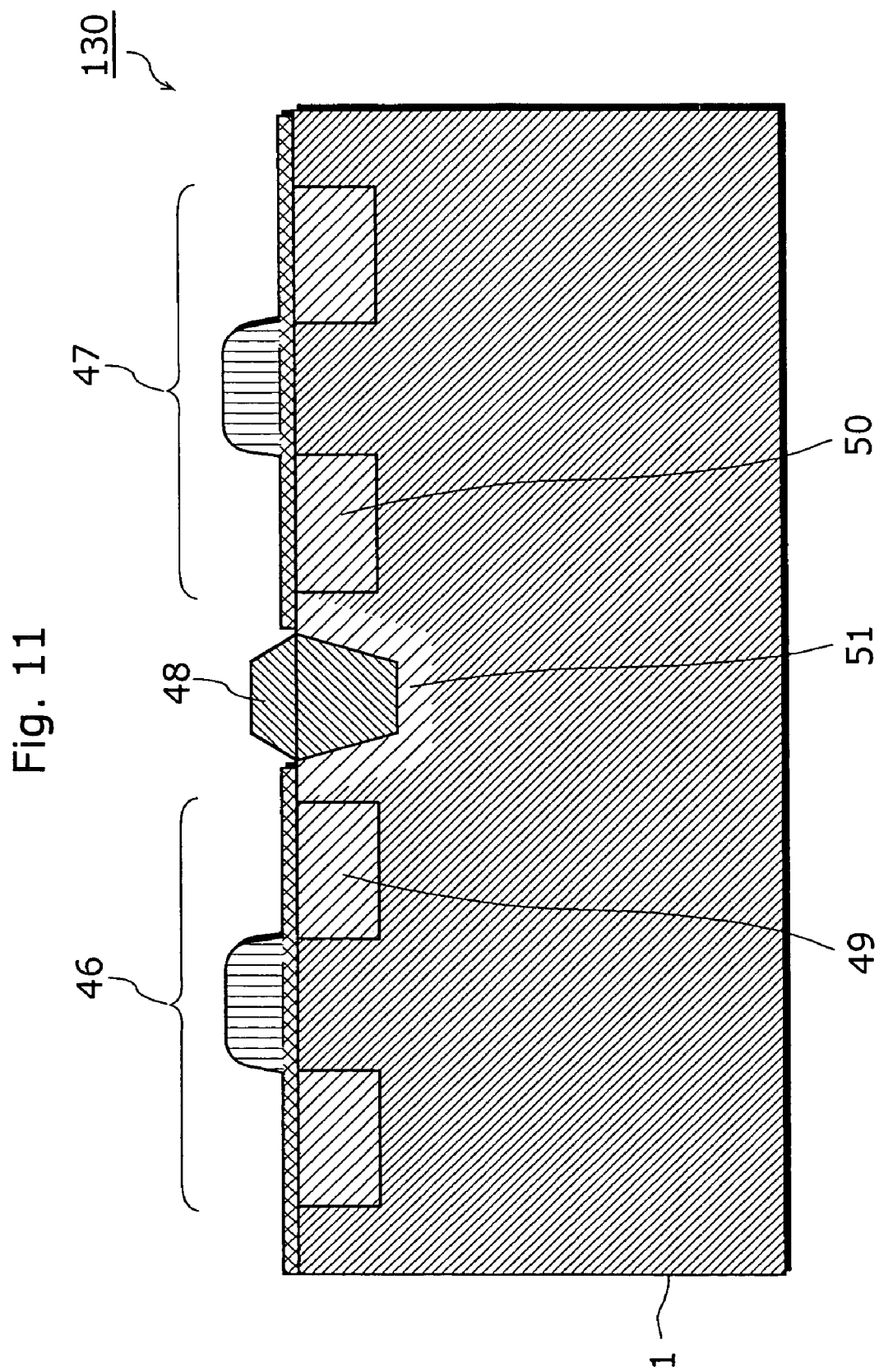
FIG. 11 is a cross-sectional view showing an example of the structure of MOS transistors and of a device isolation region of a MOS type solid-state imaging device according to the third embodiment of the present invention.

FIG. 11 is an example showing the structure of the device isolation region between the MOS transistors in the imaging region or in the periphery circuit within the MOS type solid-state imaging device according to the third embodiment. The diagram is also a cross-sectional view showing how transistors 46 and 47 are isolated by a device isolation region 48. As described above, the state of the crystal structure at the boundary between the device isolation region 48 and the silicon substrate 1 is so disordered that the leak current is generated. Therefore, it is possible to suppress the interface state leak between the device isolation region 48 and the silicon substrate 1 by forming, on the side of the silicon substrate 1, an impurity diffusion layer 51 along the interface between the side wall of the device isolation region and the silicon substrate 1.

Fourth Embodiment

Figure 12:
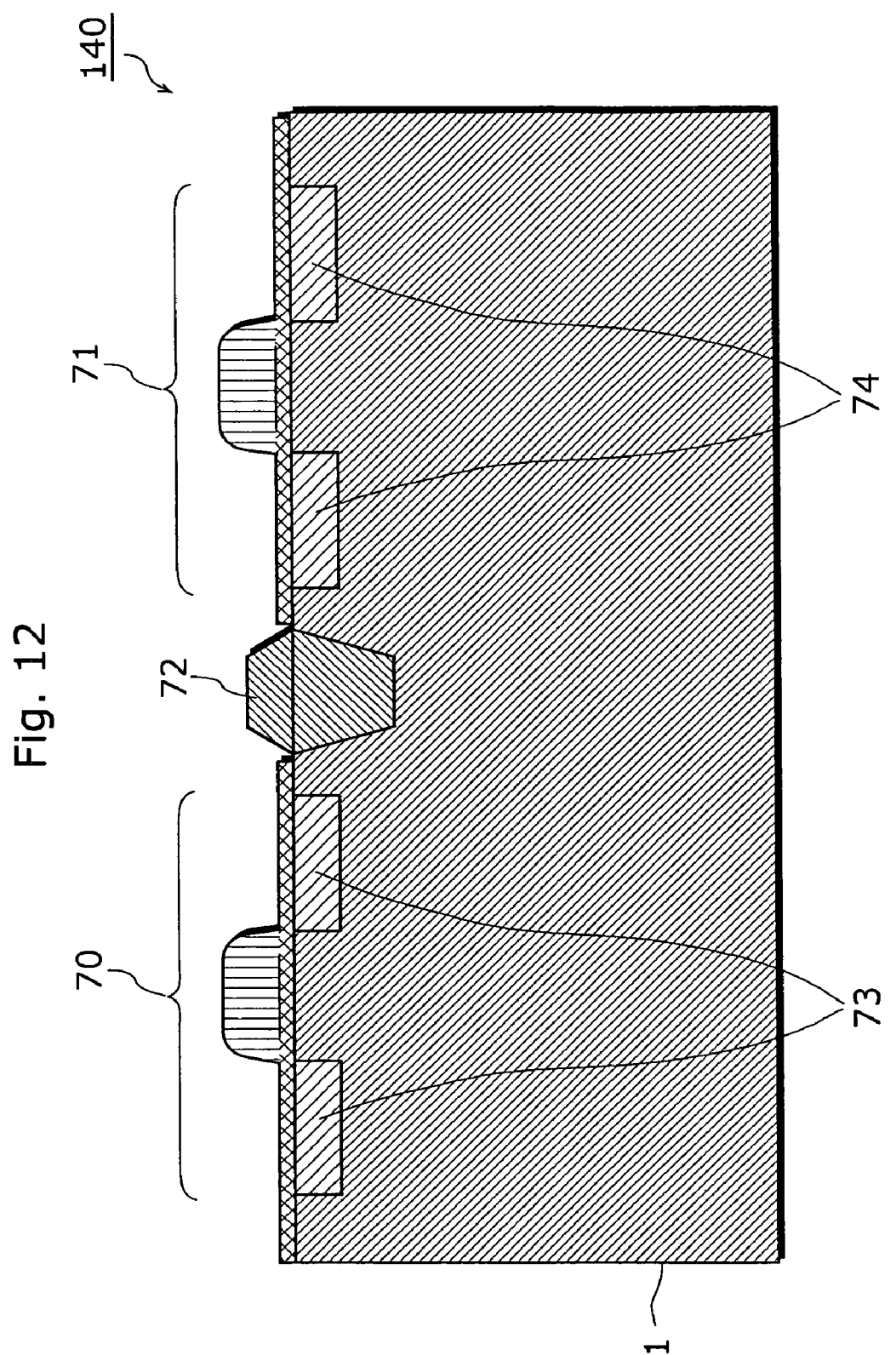
FIG. 12 is a cross-sectional view showing an example of the structure of MOS transistors and of a device isolation region of a MOS type solid-state imaging device according to the fourth embodiment of the present invention.

FIG. 12 is an example of the structure of the MOS transistor in the imaging region or the periphery circuit and the device isolation region within the MOS type solid-state imaging device according to the fourth embodiment. The diagram is also a cross-sectional view showing how transistors 70 and 71 are isolated by a device isolation region 72. As shown in FIG. 12, the depth of the device isolation region 72 measured from the surface of the silicon substrate 1 is deeper than the depth of activation regions 73 and 74. Thus, a spatial distance between the activation regions 73 and 74 increases and the leak current between them can be reduced. Either of the following isolation structures can be applied to the device isolation region 72: an STI structure in which a trench is formed in the silicon substrate 1 and is embedded using a silicon oxide; and a LOCOS structure using the silicon thermal oxide film generated by directly performing thermal oxidation on the silicon substrate 1 using a selective thermal oxidation process. As described above, the MOS type solid-state imaging device that causes small noises can be realized with whichever device isolation structure is used.

Fifth Embodiment

Figure 13:
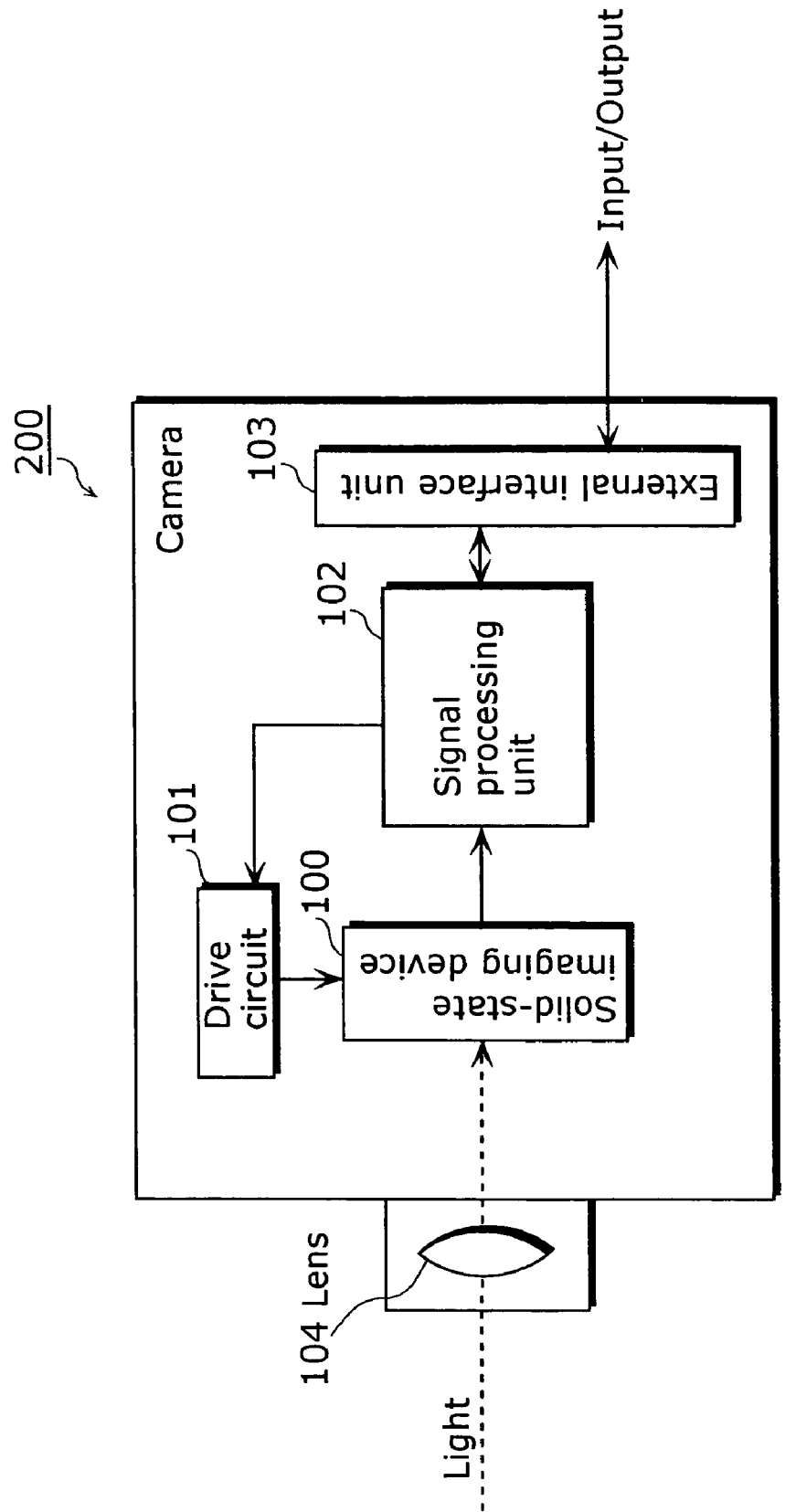
FIG. 13 is a block diagram showing a camera according to the fifth embodiment of the present invention.

FIG. 13 is a functional block diagram of a camera on which any of the solid-state imaging devices having the device isolation structures according to the above embodiments is mounted. The camera 200 is comprised of a lens 104, a solid-state imaging device 100, a drive circuit 101, a signal processing unit 102 and an external interface unit 103. The light that passes through the lens 104 enters the solid-state imaging device 100. The signal processing unit 102 drives the solid-state imaging device 100 through the drive circuit 101 and takes in the output signal from the solid-state imaging device 100. The signal processed by the signal processing unit 102 is outputted outside via the external interface unit 103.

By using the solid-state imaging device according to the first through fourth embodiments, the camera 200 can function without light as it offers high quality for pictures and the sensitivity gets higher.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The solid-state imaging device according to the present invention is effective enough to easily realize the miniaturization of the imaging region, the retaining of the withstanding pressure in the device isolation region and the reduction in the amount of dark current, as well as white flaws. It is, therefore, useful as the MOS type solid-state imaging device intended for a digital camera or the like.

What is claimed is:

1. A solid-state imaging device comprising, for each pixel, an imaging region including:
    a photodiode having a charge accumulation region of a first conductivity type;
    a transistor for reading out a charge obtained by the photodiode; and
    a device isolation region for isolating the transistor from a neighboring transistor that is located outside of the imaging region, wherein
    a depth of the device isolation region is less than a depth of the charge accumulation region, the depth of the device isolation region being a depth at which an impurity density of the charge accumulation region is at maximum.

2. The solid-state imaging device according to claim 1, wherein the photodiode further has a dark-current suppression layer of a second conductivity type formed at an upper part of the photodiode.

3. The solid-state imaging device according to claim 1, wherein the photodiode further has a dark-current suppression layer of a second conductivity type formed in contact with the device isolation region.

4. The solid-state imaging device according to claim 1, wherein the depth of the device isolation region ranges from 1 to 250 nm.

5. The solid-state imaging device according to claim 1, wherein a depth of a region forming a source or a drain of the transistor is less than the depth of the device isolation region.

6. The solid-state imaging device according to claim 1, wherein a depth of a region forming a source or a drain of the transistor is greater than the depth of the device isolation region.

7. The solid-state imaging device according to claim 1, further comprising
    a periphery circuit region including a plurality of transistors for driving the imaging region, the periphery circuit region being formed on a semiconductor substrate,
    wherein the periphery circuit region includes a device isolation region formed with a same process as used for the device isolation region in the imaging region.

8. The solid-state imaging device according to claim 7, wherein all the transistors included in the periphery circuit region are either N type MOS transistors or P type MOS transistors.

9. The solid-state imaging device according to claim 7, wherein the transistors included in the periphery circuit region are CMOS transistors.

10. The solid-state imaging device according to claim 1, further comprising
    a periphery circuit region including a plurality of transistors for driving the imaging region, the periphery circuit region being formed on a semiconductor substrate,
    wherein the periphery circuit region includes a device isolation region having a trench with a depth that is greater than the depth of the device isolation region in the imaging region.

11. The solid-state imaging device according to claim 1, wherein the device isolation region is formed based on a trench isolation method.

12. A solid-state imaging device comprising, for each pixel, an imaging region including:
    a photodiode having a charge accumulation region of a first conductivity type;
    a transistor for reading out a charge obtained by the photodiode; and
    a device isolation region for isolating the transistor from a neighboring transistor that is located outside of the imaging region, wherein the photodiode further has a dark-current suppression layer of a second conductivity type extending to the device isolation region, a depth of the device isolation region is less than a depth of the charge accumulation region of the first conductivity type, and the dark-current suppression layer is in contact with an entire lower periphery of the device isolation region.

13. The solid-state imaging device according to claim 12, wherein the dark-current suppression layer is formed at an upper part of the photodiode.

14. The solid-state imaging device according to claim 12, wherein the depth of the device isolation region ranges from 1 to 150 nm.

15. The solid-state imaging device according to claim 12, wherein the device isolation region is formed in the dark-current suppression layer.

16. A camera comprising a solid-state imaging device, the solid-state imaging device including, for each pixel, an imaging region having:

a photodiode having a charge accumulation region of a first conductivity type;

a transistor for reading out a charge obtained by the photodiode; and a device isolation region for isolating the transistor from a neighboring transistor that is located outside of the imaging region, wherein a depth of the device isolation region is less than a depth of the charge accumulation region, the depth of the device isolation region being a depth at which an impurity density of the charge accumulation region is at maximum.

17. A camera comprising a solid-state imaging device, the solid-state imaging device including, for each pixel, an imaging region having:

a photodiode having a charge accumulation region of a first conductivity type;

a transistor for reading out a charge obtained by the photodiode; and a device isolation region for isolating the transistor from a neighboring transistor that is located outside of the imaging region, wherein the photodiode further has a dark-current suppression layer of a second conductivity type extending to the device isolation region, a depth of the device isolation region is less than a depth of the charge accumulation region of the first conductivity type, and the dark-current suppression layer is in contact with an entire lower periphery of the device isolation region.

* * * * *